United States Patent [19]

Sezi et al.

[11] Patent Number: 5,173,393
[45] Date of Patent: Dec. 22, 1992

[54] ETCH-RESISTANT DEEP ULTRAVIOLET RESIST PROCESS HAVING AN AROMATIC TREATING STEP AFTER DEVELOPMENT

[75] Inventors: Recai Sezi, Roettenbach; Michael Sebald, Hessdorf-Hannberg; Rainer Leuschner, Grossenseebach; Siegfried Birkle, Hoechstadt; Hellmut Ahne, Roettenbach, all of Fed. Rep. of Germany

[73] Assignee: Siemens Aktiengesellschaft, Munich, Fed. Rep. of Germany

[21] Appl. No.: 513,570

[22] Filed: Apr. 24, 1990

[30] Foreign Application Priority Data

Apr. 24, 1989 [DE] Fed. Rep. of Germany ....... 3913431

[51] Int. Cl.$^5$ .................... G03F 7/023; G03F 7/36
[52] U.S. Cl. .................... 430/323; 430/189; 430/192; 430/193; 430/326; 156/643; 156/646
[58] Field of Search ............... 430/313, 326, 323, 192; 156/646, 643

[56] References Cited

U.S. PATENT DOCUMENTS

| | | | |
|---|---|---|---|
| 4,196,003 | 4/1980 | Watanabe | 430/193 |
| 4,388,397 | 6/1983 | Kanai | 430/313 |
| 4,634,495 | 1/1987 | Gobrecht et al. | 430/313 |
| 4,804,612 | 2/1989 | Asaumi et al. | 430/313 |
| 4,865,945 | 9/1989 | Noguchi et al. | 430/313 |
| 4,873,176 | 10/1989 | Fisher | 430/323 |

FOREIGN PATENT DOCUMENTS

| | | |
|---|---|---|
| 0261315 | 3/1970 | European Pat. Off. |
| 187421 | 7/1986 | European Pat. Off. |
| 3625264 | 3/1971 | Fed. Rep. of Germany |
| 3508450 | 9/1972 | Fed. Rep. of Germany |
| 3414104 | 6/1981 | Fed. Rep. of Germany |
| 3724368 | 2/1983 | Fed. Rep. of Germany |

OTHER PUBLICATIONS

Patent abstracts of Japan, vol. 7, No. 18 (P-170 1163, Jan. 25, 1983.
Patent abstracts of Japan, vol. 5, No. 74 (E-57 746; May 16, 1981.
Fredericks et al., Deep UV Resists, IBM Technical Disclosure Bulletin, vol 23. No. 9, Feb. 1981, p. 4132.
Duran et al, Applications of Polyimides as Lithographic Resists, IBM Technical Disclosure Bulletin, vol. 25, No. 2, Jul. 1982, p. 768.
Endo et al, A New Photobleachable Positive Resist for KrF Excimer Laser Lithography, Japanese Journal of Applied Physics, vol. 27, No. 11 Nov. 1988, pp. L2219-L2222.

Primary Examiner—Charles L. Bowers, Jr.
Assistant Examiner—John S. Y. Chu
Attorney, Agent, or Firm—Hill, Van Santen, Steadman & Simpson

[57] ABSTRACT

A photoresist system that is easily structurable and, in particular, is suitable for the deep ultraviolet range is provided. An increased etching resistance to a halogen-containing plasma is produced in a lithographically generated photoresist structure by treatment with a reactant. The reactant comprises predominantly aromatic structures and includes reactive groups that are suitable for chemical reaction with further reactable groups of the photoresist. In an embodiment, the photoresist includes anhydride or epoxy groups that are suitable for structuring with deep ultraviolet light.

9 Claims, 1 Drawing Sheet

ETCH-RESISTANT DEEP ULTRAVIOLET RESIST PROCESS HAVING AN AROMATIC TREATING STEP AFTER DEVELOPMENT

BACKGROUND OF THE INVENTION

The present invention relates to an etch-resistant photoresist system, particularly for light in the deep ultraviolet range, and a method for producing dimensionally accurate structures, particularly in the sub-$\mu$m, on semiconductor substrates using the photoresist system of the present invention.

Plasma etching is one of the most important process steps in manufacturing structures for micro-electronics. Substrates that have a surface composed of semiconductors, insulating material, or of metals, can be structured through plasma etching. In many plasma etching processes halogen-containing plasma is used. The plasma is composed, for example, of etching gases such as $CF_4$, $SF_6$, $BCl_3$, $Cl_2$, $CHCl_3$, $CHF_3$, perfluoropropane, and hexafluoroethane. An example of such an etching process is the etching of a silicon substrate with $CHF_3$ or $CF_4$ gas.

During the etching process, in order to produce a structure in the silicon substrate, the surface regions that are not to be etched must be covered with an etch-resistant material. The etch-resistant material must in turn be structured, in a lithographic manner, with radiation. Radiation, such as visible or ultraviolet light, gamma rays, or electron rays are typically used in this regard to modify the chemical structure of the etch resist such that, for example, it becomes less or more soluble to a developer in comparison to the unirradiated regions. As a result thereof, the more soluble regions of the etch-resistant layer dissolve out, the structure of the more insoluble regions remain. These regions must have an adequate stability in the etching plasma used for etching the substrate.

Principally organic polymers are utilized as resists. Resists that predominantly contain aromatic hydrocarbons have a significantly higher stability vis-a-vis a halogen-containing plasma than do resist having a purely aliphatic structure.

In addition to the resist-associated considerations such as structurability and etching resistance, additional considerations must be taken into account for producing a highresolution structure. In a photolithographic process, for example, the properties of the stepper used for the exposure or, of the stepper lens that influence the obtainable minimum structural size that is obtainable (critical dimension CD) must be considered as well as wavelength and the numerical aperture NA pursuant to the equation:

$$CD = f \frac{\lambda}{NA}$$

Because standard photoresists are structured through exposure to light having wavelengths of 365 nm or 436 nm, the resolution of the photoresist can be improved, according to the equation set forth above, by utilizing a shorter exposure wavelength, for example 248 nm. However, alkaline developable etch-resistant resists that produce half-$\mu$m structures, having an adequately layer thickness ($\geqq$ 900 nm) do not exist for this wavelength; this wavelength (248 nm), is in the deep ultraviolet range.

Most commercially available resists (for example, a resist based on a novolak), due to their aromatic structure, have a highly unbleachable absorption particularly in the deep ultraviolet range (DUV) which includes, for example, light having a wavelength of 248 nm. Therefore, these resists are unsuitable for producing fine structures with DUV. In this regard a highresolution resist must have good bleachability. Additionally, a resist should initially have a high absorption in the range of exposure in order to guarantee a correspondingly high sensitivity of the resist. However, during the course of the exposure, the resist should become transparent with respect to the radiation utilized, so that the layer regions of the photoresist that lie therebelow can also be reached by an adequately great light intensity.

Heretofore, this problem has been dealt with in that a DUV-transparent material was photo-structured and an etching resistance was then only produced in the photoresist structures thereafter on the basis of a suitable treatment.

In published patent application GB-A 2 121 197, it is disclosed that a positive electron resist polymethacryloylchloride is after-treated with aromatic amines and silicon or aluminum compounds in an organic solution after lithographic structuring in order to increase etching resistance. This method, however, includes the disadvantages that the resist material is sensitive to hydrolysis and forms corrosive hydrochloride acid with moisture that cannot be avoided. Further, the method suffers the disadvantage that the reactions are extremely difficult to control.

EP-A 00 98 922 discloses a bilayer system wherein the ultraviolet absorption of the upper resist layer is increased through treatment with vapors of naphthalene, anthracene, and the like. The etching resistance of the upper resist layer is thus increased. But, simultaneously therewith, the absorption of wavelengths below 300 nm is also increased. The resist layer is thereby barely sensitive at all to these wavelengths. The process is also so complex that it is unsuitable for commercial production.

U.S. Pat. No. 4,289,573 discloses a method for increasing the etching resistance of resists by treatment with sodium hydroxide or potassium hydroxide. The method, however, is also unsuitable for commercial production purposes since alkali ions are completely undesirable in silicon technology. Moreover, this process is extremely complex to implement.

SUMMARY OF THE INVENTION

The present invention provides a photoresist system for light in the deep ultraviolet range. The photoresist system of the present invention combines a basic polymer having a high degree of deep ultraviolet light transparency and a photo-active component having good bleachability with a high etching resistance. The photoresist can be applied in a simple manner.

To this end, the present invention provides an etching resistant photoresist system, particularly a photoresist system suitable for a lithography in the deep ultraviolet range, composed of: a photoresist that is well-structurable with radiation of a given wavelength, comprising groups that are reactable after the development, but, that are stable under normal or storage conditions; and a reactant that is present in an aqueous solution, emulsion, or a composition that includes water. The reactant includes predominantly aromatic structures and includes reactive groups that are suitable for reacting with the reactable groups of the developed photoresist structure.

In an embodiment, the photoresist comprises as reactable groups anhydride or epoxy groups. In a further embodiment, the photoresist contains a polymer that is derived from maleic acid anhydride monomers.

In an embodiment, the photoresist contains an alternating copolymer of maleic acid anhydride and styrol.

In an embodiment, the photoresist comprises a basic polymer and a photo-active component whose basic polymer contains anhydride groups.

In and embodiment, the reactant comprises at least one primary or secondary amino group as a reactive group.

In an embodiment, a diamine which comprises an at least partially aromatic structure is contained in the reactant.

The present invention also provides a method for producing, through photolithographic structuring, dimensionally accurate structures, particularly in the sub- 0.5 μm range. The method includes the following steps:

applying onto a substrate a layer of an easily structurable photoresist, having a base polymer that is adequately transparent with respect to the exposure radiation, the photoresist comprising groups that are stable under normal conditions, but are reactive after development;

exposing and developing the resist layer to thereby generate a resist structure;

treating the resist structure with a reactant that has aromatic structures and comprises reactive groups to create the formation of a chemical compound with the reactable groups of the generated resist structures;

rinsing as required the resist structure treated with water and drying; and etching the substrate in a halogen-containing plasma using the treated resist structure as an etching mask.

In an embodiment of the method, the reactant is present in an aqueous solution or emulsion.

In an embodiment of the method, the treatment of the resist structure with the reactant is implemented in a spray, puddle, or immersion developer.

In an embodiment of the method, the treatment is implemented at room temperature.

In an embodiment of the method, the treatment is implemented at normal pressure.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
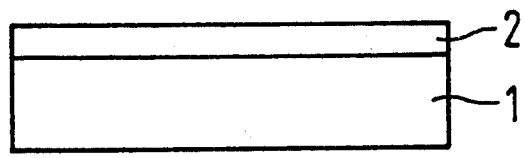
FIG. 1 illustrates a cross-sectional view of a structure after a step of the method of the present invention.

A photoresist system is provided for deep ultraviolet range radiation that combines a basic polymer having deep ultraviolet light transparency and a photoactive component having good bleachability with a high etching resistance. The photoresist can be applied in a simple manner.

Briefly the etch-resistant photoresist system comprises: a photoresist, that is well-structurable utilizing radiation of a given wavelength, the photoresist including groups that are reactive after development, but, are resistant under normal and storage conditions; and a reactant, that is present in a solution, emulsion, or composition that includes water, the reactant having predominantly aromatic groups and includes reactive groups that are suitable for reacting with the reactive groups of the photoresist structure.

The photoresist system of the present invention is distinguished, in part, by the fact that the two constituents of the system are selectable relatively independently of one another. Thus, the photoresist can be selected so that independently of the desired etching resistance a high resolution can be achieved combined with a high transparency of the basic polymer for radiation of a given wavelength.

A reactant is used for increasing the etching resistance that can be selected independently of its behavior with respect to radiation exposure; because its absorption for the exposure radiation does not influence the structuring of the photoresist. Only the reactive groups must be adapted to the reactable groups of the photoresist that is used. The reactive groups are selected so that a chemical bonding can be achieved under simple conditions, for example, at room temperature and in an open system.

Because the reactant is present in an aqueous system, such as a solution or emulsion, the system of the present invention is simple. Uncomplicated, known devices are only required for handling the reactant and indeed, for handling the entire photoresist system. These devices need not be capable of performing vacuum steps or tempering steps. Overall, the photoresist system of the present invention ensures a good structurability and a high etching resistance, particularly to halogen-containing plasma.

It has been found, for example, with respect to the photoresist, that polymers that have anhydride or epoxy groups have reactable groups that do not exhibit an increased absorption of deep ultraviolet light (for example, 240 through 280 nm). A photoresist can be selected that is composed of a basic polymer and a photo-active constituent, the photo-active constituent being matched to the irradiation wavelength and the basic polymer containing anhydride or epoxy groups. The anhydride functions can be cyclic or linear and can be contained both in the main chain, as well as, in a side chain of the basic polymer.

Basic polymers that are obtained by polymerization or co-polymerization of olefinically unsaturated carbonic acid anhydrides are easily accessible. The structures A, B, or D set forth below represent examples of such monomers:

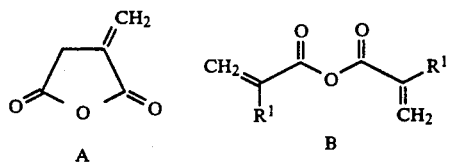

A      B

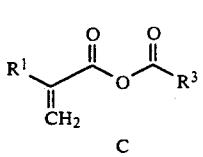 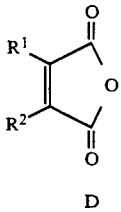

C    D

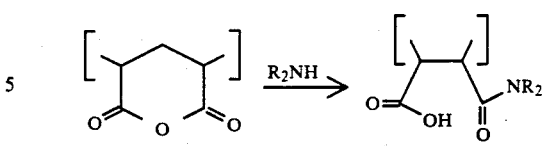

wherein:

the radicals $R^1$ and $R^2$ are H or alkyl; and $R^3$ is an alkyl or aryl radical.

Copolymers including other monomers are also possible. To this end, the portion of the monomer that carries the anhydride function can comprise approximately 1 to about 100 percent of the compound.

The basic polymer of the photoresist can be derived from maleic acid anhydride monomers that comprise 10 to 55 mol percent and can, for example, be utilized as an alternating copolymer with styrol as a co-monomer.

With respect to the photo-active constituents, suitable photo-active constituents for, in particular, deep ultraviolet light are known. Quinone diazides are well suited for this function. By way of example, quinone diazides having structures such as those set forth below in formulas E, F, or G, or derived therefrom, have been found to function satisfactorily:

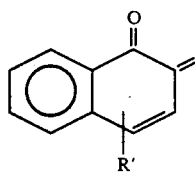 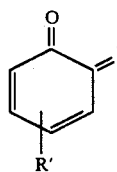 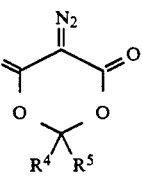

E    F    G wherein:

$R^4$ and $R^5$ are an arbitrary organic radical chosen independently of one another;

R' is —$SO_3R$ or —$CO_2R$; and

R is alkyl, aryl, halogenalkyl, halogenaryl, or halogen.

The complete chemical structure of the photo-active constituent is matched to the basic polymer used. When, for example, one proceeds on the basis of a reactive carbonic acid or sulfonic acid derivatives that are derived from compounds E-G above, then conversion products with aromatic or aliphatic H-acidic compounds such as alcohols, phenols, and amines are preferred. A 4-sulfonic acid ester of naphthoquinone diazide with multivalent phenols, for example, with bisphenol A, is well-suited in combination with a basic polymer that contains maleic acid.

With respect to the reactive groups, if the above examples of the photoresist are utilized, preferably the reactant comprises primary or secondary amino functions. Compounds that carry at least one of these reactive groups can be aromatic or only partially aromatic, structures; these compounds, for example, can include an aryl-substituted aliphatic amine, preferably a diamine. When the agent or compound is a multi-functional compound, then OH groups can also be used in addition to the amino groups.

The amino group is especially well-suited for reaction with an anhydride group, pursuant to the reaction:

An amidocarbonic acid is formed in the first step that is, in turn, capable of reacting with further reactive groups, for example, with further amino or alcohol groups. Photoresists or, respectively, basic polymers that contain epoxy, react similarly with amino groups, whereby α- and β-aminoalcohols are formed in the first reaction step. These can then enter into further reactions with, for example, the epoxy groups.

If the reactant is a multi-functional compound, then a cross-linking of the photoresist occurs. This has a further positive effect in that etching resistant is further increased as a result thereof.

Treatment with the reactant also causes a swelling of the resist structure. It is swelling, due to the reactant treatment, that provides an additional, positive benefit, in that it provides a controllable layer growth that creates an etching reserve due to the greater layer thickness. Thus, the resist can be structured, in a thin layer, with good resolution, and can be thickened with the reactant up to an adequate etching resistance.

The photoresist system of the present invention can be advantageously used in a method for generating dimensionally accurate photolithographic structures in micro-electronic components. In particular, the photoresist system can be used in methods for structure widths in the sub-μm range. To this end, a photoresist structure applied on a substrate, that is exposed in a structuring step, developed and treated with a reactant, can then function as an etching mask in a plasma etching process that contains halogen-containing etching gases. To that end, a substrate, that can include a surface composed of semiconductor material, oxide, or metal to be etched, is coated with a selected photoresist, is exposed with radiation at a given wavelength for generating a latent image, and is developed.

After the above steps, the photoresist structure is subsequently treated with a reactant. Because no additional special, further measures are required for this step, this treatment can be undertaken in a simple apparatus such as, for example, in a spray, puddle, or immersion developer, at room temperature. The reactive groups of the reactant enter into a chemical reaction with the reactable groups of the photoresist present in the photoresist structure and this results in the reactant bonding to the photoresist. As a result of the at least partially aromatic structure of the reactant, an intensified etching resistance of the photoresist to, for example, a halogen-containing plasma is achieved. Pursuant to the present invention, the etching resistance can be further increased by using multi-functional compounds as a reactant.

The process can be performed so that there is a complete reaction of all reactable groups in the photoresist structure, alternatively, it can be controlled to a desired extent based on the duration of the treatment, the concentration of the reactant in the solution or emulsion, or through temperature. After the treatment, the photoresist structure is rinsed with alcohol, water, or the like. If desirable, the structure can be dried. In addition to treatment with a reactant that is in a liquid phase, the photoresist structure, if desired, can also be treated in a vapor phase.

Following this process, the substrate, or the parts thereof not covered by the photoresist structure, can be etched. For example, etching can occur in a plasma that contains a halogen, whereby the photoresist structure serves as an etching mask for the substrate because of its high etching resistance to the plasma.

The invention ensures that the photoresist structure is not eroded or is not noticeably eroded by the plasma during the course of the etching process. The etching step therefore proceeds with a high degree of dimensional accuracy. This ensures that the structures prescribed on the mask are transferred onto the substrate without a spreading or dimensional loss. Steep sidewalls in the etching profiles can only be created in this manner. Further measures for treating the substrate can be performed following the etching step. At the end, the photoresist structure is removed.

By way of example, and not limitation, the compositions of two photoresist systems of the present invention are set forth below and their use in a method of the present invention is also set forth in greater detail with reference to two exemplary embodiments and the Figures. The Figures illustrates different method steps in the production of structures in or, respectively, on a substrate in schematic cross-sections.

First Photoresist System Example

A copolymer of styrol and maleic acid anhydride having a molecular weight $M_n = 2400$ (created by radical polymerication of the two monomers) is used as a basic polymer. 16 weight parts thereof were dissolved with four weight parts of a diester of bisphenol A with naphthoquinonediazide-4-sulfonic acid in 80 weight parts 2-methoxy-1-propylacetate. The resultant product is hereinafter referred to as resist solution a1).

An emulsion for treating the photoresist structure was created composed of 0.5 weight parts 3-(aminomethyl)-benzylamine, 0.5 weight parts aminomethylnaphthaline, 0.5 weight parts emulsifier (for example, Pril), and 98.5 weight parts water. The emulsion is hereinafter referred as b1).

Second Resist System Example

Again, a basic polymer that is a copolymer of styrol and maleic acid anhydride was used, but it had a molecular weight $M_n = 6700$. 13.6 weight parts of this polymer was used together with 3.4 weight parts of the photo-active constituent used in the first example, and was dissolved in 80 weight parts 2-methoxy-1-propylacetate. The resultant product is hereinafter referred to as resist solution a2).

A solution for treating this photoresist structure was created composed of one weight part 3-(aminomethyl)-benzylamine, one weight part aminomethylnaphthaline, 49 weight part isopropyl alcohol, and 49 weight parts water. The resultant product is referred to as b2) below.

First Example

As illustrated in FIG. 1, the resist solution a1) was spun onto a silicon wafer substrate 1 and dried on a hotplate at 100° C. The thickness of the photoresist layer 2 generated was 900 nm.

A contact exposure was performed through a mask with a dose of 140 mJ/cm² at a wavelength of 246 through 268 nm. For development, a mixture of 5 weight parts water, one weight part of the developer AZ 400K (Hoechst AG), and 0.5 weight parts ammonia was used.

Figure 2:
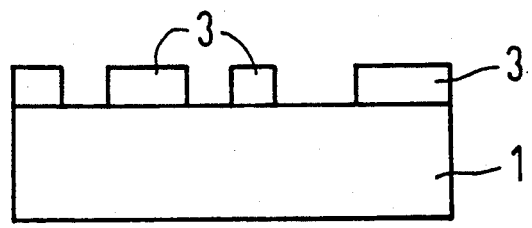
FIG. 2 illustrates a cross-sectional view of the structure after a further step of the method of the present invention.

FIG. 2 illustrates the arrangement after approximately 45 to 60 seconds of development. The photoresist structures 3 that have arisen exhibit a resolution down to a structure width of about 0.5 μm. After repeated drying on a hotplate, the arrangement with the photoresist structure 3 is dipped into emulsion b1) for 120 seconds, and then was removed therefrom. The structure was rinsed with isopropylalcohol and again dried at 110° C.

Figure 3:
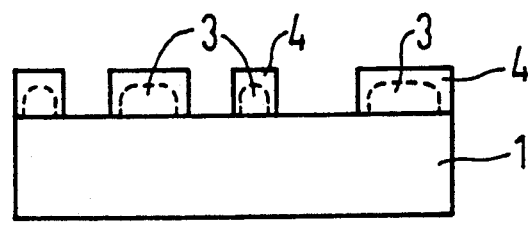
FIG. 3 illustrates a cross-sectional view of the structure after a further step of the method of the present invention.

FIG. 3 illustrates the arrangement wherein a chemical modification has occurred in the surface-proximate regions 4 of the photoresist structure 3. The modification is due to a chemical reaction with the treatment solution. The arrangement was then etched in a plasma reactor with a gas mixture composed of tetrafluoromethane plus 10 (volume) percent oxygen given a bias voltage of 450 volts and a gas pressure of 30 mTorr.

Figure 4:
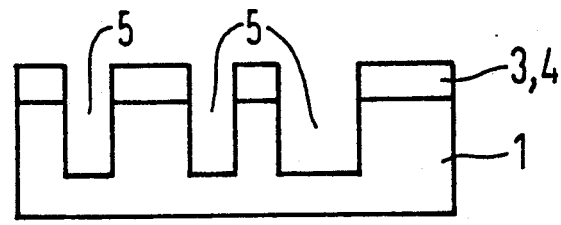
FIG. 4 illustrates a cross-sectional view of the structure after a further step of the method of the present invention.

FIG. 4 illustrates the arrangement after the etching step. Trenches 5 that have vertical sidewalls are created in the substrate at those regions of the substrate 1 not covered by the photoresist structure (3, 4).

Second Example

Reference numerals in this example also refer to FIGS. 1-4.

The photoresist solutions a2) was again spun onto a silicon wafer substrate 1 and was dried on a hotplate at 110° C. The layer thickness of the photoresist layer 2 generated was 900 nm. Contact exposure was performed with a mask at 180 mJ/cm² at a wavelength of 240 through 260 nm. For development, 5 weight parts water were diluted with one part of the commercially available developer AZ 400K (Hoechst AG), laced with 0.5 weight parts ammonia and the arrangement was developed therewith for 45 to 60 seconds.

The photoresist structures 3 (FIG. 2) that were created exhibited a resolution down to 0.5 μm structure width. After drying at 110° C., the arrangement with the photoresist structures 3 on the substrate 1 was dipped into the solution b2) for 120 seconds. The resist was then rinsed with isopropylalcohol and dried at 110° C.

The photoresist structure 3 includes chemically modified, surface-approximate regins 4 that have an increased etching resistance (see FIG. 3). A further increase in the etching resistance can be effected by a flood lighting of the resist structures with a dose of about 50 mJ/cm². The chemical reaction of the resist with the treatment solution was thereby accelerated. The arrangement illustrated by FIG. 3 was now etched in a plasma reactor under the same etching conditions as in the first example.

The etching rates, in a halogen-containing plasma defined in the examples of the embodiments of the photoresist structures treated pursuant to the present invention are compared below to the etching rates of untreated photoresist structures of maleic acid anhydride/styrol copolymer and a commercial developer.

| Material to be Etched | Etching Rate |
| --- | --- |
| Styrol/Maleic acid anhydride, untreated | 53 nm/min |
| Photoresist AZ 1450 J | 41 nm/min |
| Styrol/maleic acidanhydride, first exemplary embodiment, treated | 35 nm/min |

| Material to be Etched | Etching Rate |
|---|---|
| Styrol/MSA, second exemplary embodiment, treated | 35 nm/min |

As illustrated above, there is an increase in the etching resistance to a halogen-containing etching plasma effected by the treatment of the present invention. The photoresist structures treated pursuant to the present invention or, respectively, the photoresist system of the invention, is therefore excellently suited for use as an etching mask for halogen-containing plasma.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for dimensionally accurate, photolithographic structure production, comprising the following steps:
   a) applying onto a substrate a layer of an easily structurable photoresist, having a base polymer that is adequately transparent for the exposure radiation and a photoactive constituent, o-quinone diazide, the photoresist comprising groups that are reactive after development;
   b) exposing in the deep ultraviolet range and developing in an aqueous alkaline solution the resist layer for generating a resist structure;
   c) treating the resist structure with a reactant that has aromatic structures and comprises reactive groups for creating a chemical compound with the reactable groups of the generated resist structures; and
   d) etching the substrate in a halogen-containing plasma using the treated resist structure as an etching mask.

2. The method of claim 1 wherein the reactant is present in an aqueous solution.

3. The method of claim 1 wherein the reactant is present in an emulsion.

4. The method of claim 1 wherein the reactant is present in a composition that includes water.

5. The method of claim 1 wherein the treatment of the resist structure with the reactant is implemented in a spray, puddle or immersion developer.

6. The method of claim 1 wherein the treatment is implemented at room temperature.

7. The method of claim 1 wherein the treatment is implemented at ambient pressure.

8. The method of claim 1 wherein after step c, the resist structure is rinsed.

9. The method of claim 8 wherein the resist structure is dried after rinsing.

* * * * *